United States Patent [19]
Andrews

[11] Patent Number: 5,243,243
[45] Date of Patent: Sep. 7, 1993

[54] ELECTRIC MOTOR INSULATION RESISTANCE FAULT MONITOR

[76] Inventor: J. Leroy Andrews, 4487 Country Club La., Stow, Ohio 44224

[21] Appl. No.: 790,559

[22] Filed: Nov. 12, 1991

[51] Int. Cl.$^5$ .................. H02K 11/00; H04B 3/46; H02H 7/08
[52] U.S. Cl. ..................... 310/72; 324/544; 340/648; 361/23
[58] Field of Search .............. 310/68 R, 72; 361/23, 361/24, 29; 324/523, 525, 527, 544; 340/648, 635

[56] References Cited

U.S. PATENT DOCUMENTS

| | | | |
|---|---|---|---|
| 3,656,136 | 4/1972 | Blair | 340/253 R |
| 4,319,297 | 3/1982 | Lapsker | 361/23 |
| 4,367,506 | 1/1983 | Lapsker | 361/31 |
| 4,525,763 | 6/1985 | Hardy et al. | 361/24 |
| 4,716,486 | 12/1987 | Sobiepanek et al. | 361/24 |
| 4,716,487 | 12/1987 | Horvath et al. | 361/42 |
| 4,766,387 | 8/1988 | Browne et al. | 324/545 |
| 4,990,857 | 2/1991 | Isomichi et al. | 324/551 |
| 5,155,441 | 10/1992 | Zelm | 324/551 |

OTHER PUBLICATIONS

IBM Technical Disclosure, "DC Motor Control Method Considering Overheat Protection and Performance", vol. 36, No. 1, Jan. 1993, pp. 441-442.

*Primary Examiner*—Steve L. Stephan
*Assistant Examiner*—D. R. Haszko
*Attorney, Agent, or Firm*—Tarolli, Sundheim & Covell

[57] ABSTRACT

Apparatus and method are disclosed for use with a starting circuit to prevent start-up of an electric motor when the motor's insulation resistance is of a value below a selected insulation resistance limit value below which the motor should not be energized. The selected limit value is a selected percentage of a known maximum value. A variable resistance device, such as a potentiometer, having first and second adjustable resistance portions is adjusted so that the adjusted resistance value of the second portion is of the same percentage of the total resistance value of the first and second portions as the selected percentage discussed above. A DC test voltage of a known value is applied to the motor's insulation resistance to cause a test current to flow therethrough. The test current is directed to flow through the second resistance portion to develop a test voltage. A reference voltage is provided having a value representative of the voltage that would be developed across the second resistance portion by the test current if the unknown value of the insulation resistance was equal to the selected insulation resistance limit value. The test voltage is compared with the reference voltage to provide a control signal having a first value when the test voltage is greater than the reference voltage and a second value when the test voltage is less than the reference voltage. The electric motor is prevented from being energized so long as the control signal is of the first value.

14 Claims, 3 Drawing Sheets

ELECTRIC MOTOR INSULATION RESISTANCE FAULT MONITOR

BACKGROUND OF THE INVENTION

This invention relates to the art of electric motors and more particularly to apparatus and method to be used in conjunction with a motor starting circuit for preventing start-up of a motor when its insulation resistance is of a value below a selected insulation resistance value below which the motor should no be energized.

It is known in the art that as a motor ages, the winding insulation resistance frequently decreases in value. For example, a new motor may have an insulation resistance on the order of 1,000 megohms. As the motor ages, the insulation deteriorates due to moisture, dirt and the like. In time, the insulation resistance may well decrease to a level below which the motor should not be energized. Thus, at some low level of insulation resistance, the application of a high voltage, such as 480 volts, may result in heating of the insulation causing vaporization of moisture resulting in the burning of the insulation. This may cause the resistance to further decrease which could well result in the current increasing to such a level that the metal employed in the windings may tend to melt, causing severe damage to the motor.

It is known in the art to periodically perform a test for measuring insulation resistance of a motor. The test is frequently referred to in the art as a megger test. In such a test, it is common to apply a fixed DC voltage, on the order of 500 volts, between the motor leads and ground. The insulation resistance is read directly from the meter in megohms. Such a megger test is typically performed by a technician employing a portable instrument to apply the test voltage and obtain a reading of the megohms while the motor is de-energized. Nothing is employed that will prevent an operator from starting such an electric motor that has recently been inspected and found to have a low megohm reading. It is desirable that instrumentation be provided as part of a motor starting circuit to prevent start-up of a motor whenever it is determined that the motor's insulation resistance is of a value below which the motor should not be energized.

SUMMARY OF THE INVENTION

In accordance with one aspect of the present invention, apparatus is provided for use with a starting circuit for an electric motor for preventing start-up of the motor when the motor's insulation resistance is of a value below a selected insulation resistance limit value and below which the motor should not be energized. The selected limit value is a selected percentage of a known maximum value. The apparatus includes a variable resistance, such as a potentiometer, having adjustable first and second resistance portions together with means for adjusting the resistance portions so that the second resistance portion may be adjusted such that its resistance value relative to the total resistance value of both the first and second resistance portions is the same percentage as the selected percentage. A known DC test voltage is applied to the motor's insulation resistance to cause test current to flow therethrough. Circuitry is provided for directing the test current to flow through the second resistance portion in order to develop a test voltage. Circuitry is also provided for establishing a reference voltage having a value representative of the voltage that would be developed across the second resistance portion by the test current if the insulation resistance value was equal to the selected insulation resistance limit value. A comparator is provided for comparing the test voltage with the reference voltage and providing a motor control signal having a first value when the test voltage is greater than the reference voltage and a second value when the test voltage is less than the reference voltage. Circuitry responds to the motor control signal for preventing energization of the motor so long as the motor control signal is at the first value representative that the test voltage is greater than the reference voltage.

In accordance with another aspect of the present invention there is provided a method of determining whether to start operation of an electric motor wherein the motor has an insulation resistance of an unknown value. This method includes the step of selecting the limit value of the insulation resistance below which the motor should not be energized. The selected limit value is a selected percentage of a known maximum limit value. The method also includes the step of adjusting a variable resistance means having first and second adjustable resistance portions such that the adjusted resistance value of the second portion is the same percentage of the total resistance value of the first and second portions as is the selected percentage discussed above. A DC test voltage of a known value is applied to the motor's insulation resistance to cause a test current to flow therethrough. The test current is directed to flow through the second resistance portion to develop a test voltage. A reference voltage is provided having a value representative of the voltage that would be developed across the second resistance portion by the test current if the unknown value of the insulation resistance was equal to the selected insulation resistance limit value. The test voltage is compared with the reference voltage to provide a control signal having a first value when the test voltage is greater than the reference voltage and a second value when the test voltage is less than the reference voltage. The electric motor is prevented from being energized so long as the motor control signal is of the first value.

BRIEF DESCRIPTION OF THE DRAWINGS

The foregoing and other objects and advantages of the invention will become more readily apparent from the following description of the preferred embodiment of the invention as taken in conjunction with the accompanying drawings which are a part hereof and wherein.

DESCRIPTION OF THE PREFERRED EMBODIMENT

Figure 1:
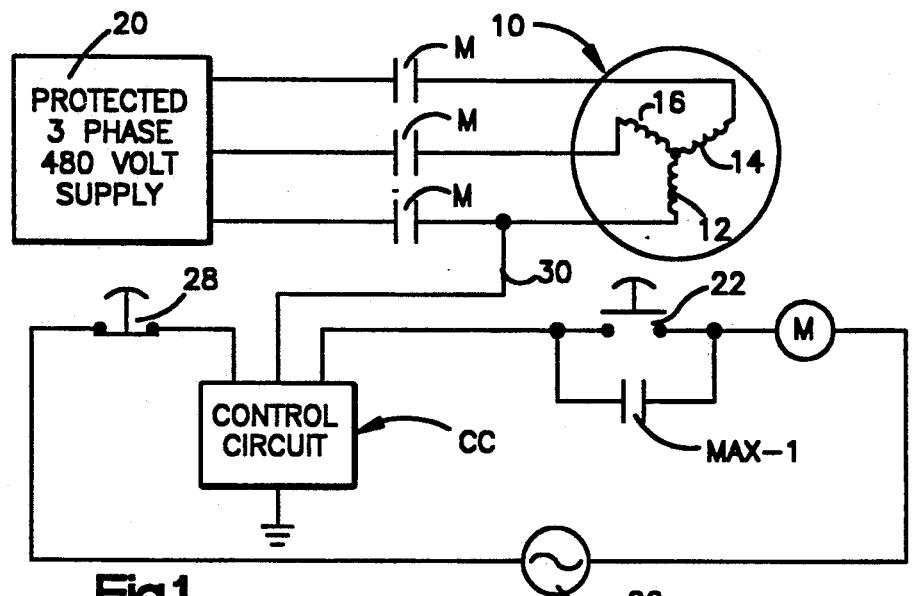
FIG. 1 is a block diagram illustration of one application of the present invention for use with a starting circuit for an electric motor.

Reference is now made to the drawings wherein the showings are for purposes of illustrating a preferred embodiment of the invention only and not for purposes of limiting same. FIG. 1 illustrates a three-phase AC electric motor having windings 12, 14 and 16 adapted to be connected by way of suitable motor starter contacts M with a protected three-phase 480 volt supply 20. A conventional starting circuit is illustrated as including a normally open start switch 22 which, when closed, serves to energize the motor starter coil M from a typical 120 volt AC line source 26 by way of a normally closed motor stop switch 28. Whenever the motor starter coil is energized, it closes the normally open motor contacts M to connect the three-phase 480 volt supply to the windings of the electric motor 10 to energize the motor. Additionally, a set of normally open auxiliary contacts MAX-1 become closed to maintain the motor energized.

In accordance with the present invention, there is provided a control circuit CC having a test lead 30 connected to one of the motor winding leads with the control circuit serving to prevent start-up of the motor 10 when the motor's insulation resistance is of a value below a selected insulation resistance limit value below which the motor should not be energized. One embodiment of the control circuit CC will be described in conjunction with FIGS. 2–4 to be described below.

Figure 2:
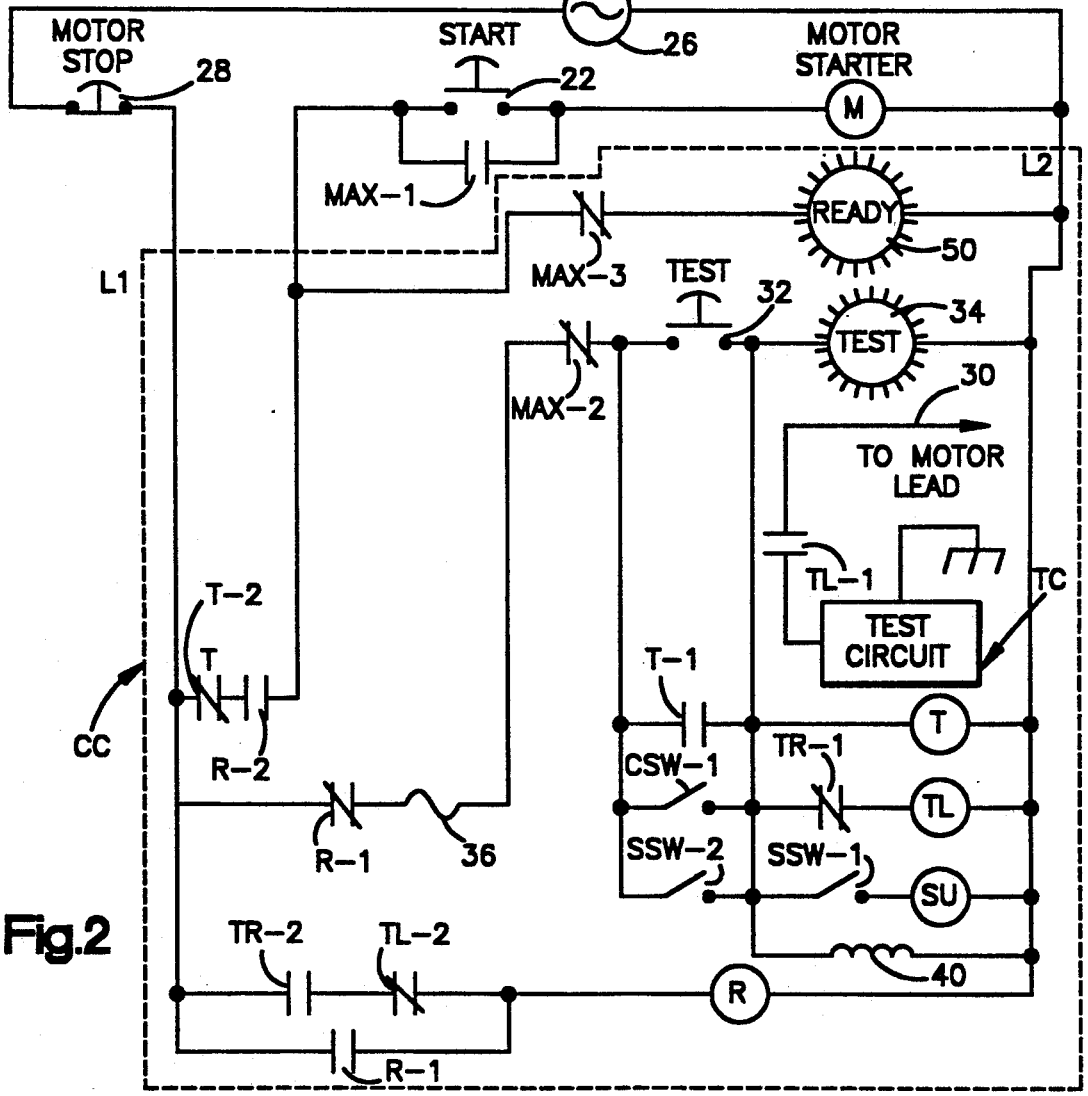
FIG. 2 is a schematic diagram illustrating the control circuit of FIG. 1 in detail.
Figure 3:
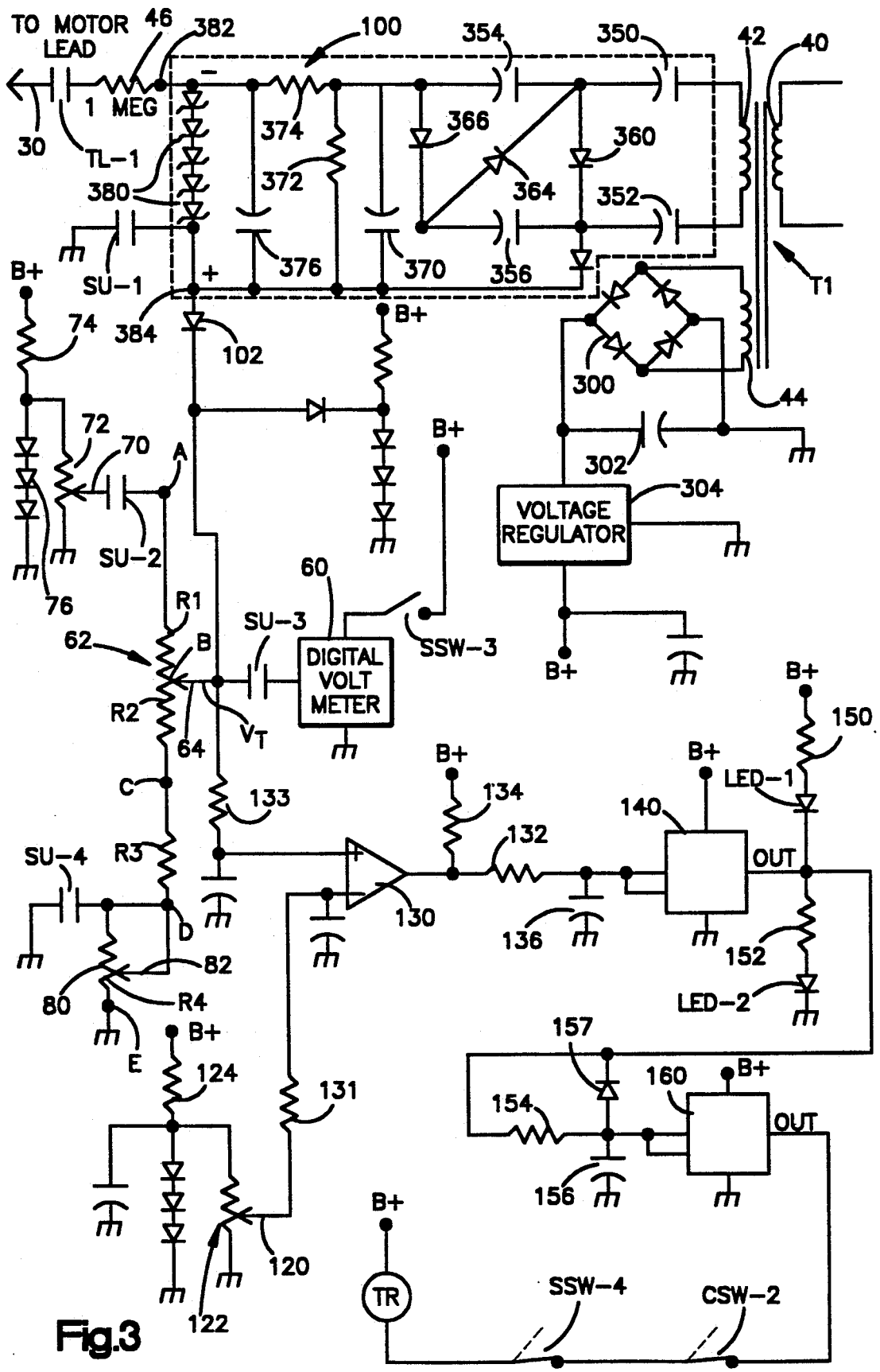
FIG. 3 is a schematic diagram illustrating the test circuit shown as a block diagram in FIG. 2.

The control circuit CC includes electronic circuitry forming a test circuit TC to be described in greater detail with respect to FIG. 3 as well as various control logic relays and contacts and indicators as shown in FIG. 2. As will be brought out in greater detail hereinafter, the operator will select a limit value for the motor's insulation resistance below which the motor should not be energized. This limit value may be a selected percentage of a known maximum value. For example, if the known maximum value is 100 megohms, the operator may select a limit value of 50 megohms or 50% of the maximum value under consideration. The operator will then adjust a potentiometer located in the test circuit. The potentiometer has a pair of variable resistor portions R1 and R2 together with a wiper arm for increasing the resistance of one portion while decreasing the resistance of the other. In such case, the operator will adjust the resistance portion of resistor R2 so that its resistance value plus the resistance of resistor R3 relative to the total resistance value of both resistor portions R1 and R2 and resistor R3 is the same percentage as the selected percentage discussed above. The operator will then actuate the normally open test switch 32 in the control circuit of FIG. 2. Upon closure of this switch, an energizing circuit is completed for energizing a test relay coil T and a test display lamp 34 by way of the closed motor stop switch 28 and a set of normally closed relay contacts R-1, a fuse 36, a set of normally closed motor starter auxiliary contacts MAX-2, the test switch 32, and thence through the relay coil T. With the relay coil T being energized, it opens all of its normally closed contacts and closes all of its normally open contacts. Thus, energization of relay coil T causes normally open contacts T-1 to close to hold in the test relay even though the operator may thereafter open the test switch 32. Energization of the relay coil T causes its normally closed contacts T-2 to open, thereby preventing energization of the motor starter coil M during the test operations.

In addition to energizing the test relay coil T, closure of test switch 32 causes energization of the primary winding 40 of a transformer T1 having secondary windings 42 and 44 located in the test circuit TC. As will be described in greater detail hereinafter, the test circuit TC provides a test voltage, on the order of 500 volts DC, which is supplied through an internal resistor 46 (see FIG. 3) and thence to the motor lead 30 after a set of normally open test lead relay contacts TL-1 have closed.

Closure of the test switch 32 also causes energization of the test lead relay coil TL causing its normally open relay contacts TL-1 to close to apply the test voltage to the motor and causing its normally closed relay contacts TL-2 to open to prevent energization of the ready relay coil R until the test procedure has been completed.

The motor test procedure will be discussed in greater detail hereinafter with reference to FIG. 3. Briefly, the motor test procedure involves applying a test voltage through the now closed test lead relay contacts TL-1 to the motor lead 30 and then to the motor's insulation resistance to ground. This causes a test current to flow through the insulation resistance. If the value of the insulation resistance is less than the selected limit value, then the test current will be of greater value than anticipated. This test current will flow through a resistance circuit to develop a test voltage which is compared with a reference voltage. The reference voltage is set at a value representative of the voltage that would be developed across the resistors R2, R3 and R4 by the test current if the value of the insulation resistance was in fact equal to the selected limit value discussed above.

The test voltage is compared with the reference voltage and a motor control signal is provided having a high value when the test voltage exceeds the reference voltage and a low value when the test voltage is less than the reference voltage. The ready relay coil R will not be energized so long as the control signal is of a high value. Consequently, once the control signal is of a low value indicative that the test voltage is less than the reference voltage, a transfer relay coil TR (see FIG. 3) will become energized causing its normally closed contacts TR-1 to open thereby de-energizing the test lead relay coil TL. This causes the test lead relay contacts TL-1 to open to remove the test voltage from the motor lead 30. In addition, the normally open transfer relay contacts TR-2 become closed to turn on the ready relay coil R. Energization of relay coil R causes its normally open contacts R-1 to close to hold the relay coil R energized. Also, energization of relay coil R causes its normally open contacts R-2 to close to complete a circuit through the normally closed motor starter auxiliary contacts MAX-3 to close to thereby energize a ready indicator light 50 which indicates to the operator that he may now start the motor by closing the motor start switch 22, because the test has indicated that the insulation resistance of the motor is not less than the selected limit value.

The test procedure including the set-up procedure as well as a check procedure will be discussed in greater detail hereinafter with particular reference to the schematic circuit of FIG. 3 in conjunction with the logic circuitry of FIG. 2.

Prior to testing the insulation resistance of the motor, the operator will select a limiting value of the insulation resistance below which the motor should not be energized. This is achieved during the set-up procedure by actuating a set-up switch to close its normally open switch contacts SSW-1, SSW-2 and SSW-3 and open its normally closed contacts SSW-4. This energizes a set-up relay coil SU (see FIG. 2) causing its normally open relay contacts SU-1, SU-2, SU-3, and SU-4 (see FIG. 3) to close. This places a digital voltmeter 60 in circuit with a potentiometer 62 to be employed by an operator when selecting the megohm limit of insulator resistance below which the motor should not be energized. The potentiometer 62 includes resistor portions R1 and R2 together with a wiper arm 64. The total resistance of resistor portions R1 and R2 is 100 kohms. The wiper arm 64 is moved by the operator to adjust the portion of this 100 kohms allocated to resistor portion R1 versus resistor portion R2.

Resistor portions R1 and R2 are connected in series between circuit points A and C with the wiper arm 64 providing a circuit point B. A fixed 500 ohm resistor R3 is connected in series with resistor portion R2 between circuit points C and D. With the set-up relay coil SU being energized, the relay contacts SU-4 are closed to connect point D to electrical ground. Point A is connected through now closed relay contacts SU-2 to the wiper arm 70 of a potentiometer 72 having its resistance portion connected between ground and the junction of a resistor 74 and a plurality of diodes 76. Resistor 74 and diodes 76 are connected together in series between ground and a B+ voltage supply source. This B+ voltage supply source is +5 volts DC. The wiper arm 70 is adjusted so that one volt is applied across resistor portions R1, R2 and resistor R3 when the set-up relay coil SU is energized. With the set-up switch SW-3 actuated to apply operating B+ potential to the digital voltmeter 60, readings may now be had. The digital voltmeter is preferably adjusted so that a full scale reading of one volt across the potentiometer and resistor R3 will result in a reading of 100 which will represent an insulation resistor limit value of 100 megohms. By adjusting the wiper arm 64 to its lowest level, point B will coincide with point C so that the minimum reading will be approximately 0.5% on the meter 60. This is representative of a limiting motor megohm resistance on the order of 0.5 megohms, or 0.5% of the full scale reading. The operator may adjust the limiting megohm resistance between these two levels of 0.5% and 100% by adjusting the wiper arm 64 and noting the reading on the digital voltmeter 60. For example, such adjustments may correlate with those set forth in Table I produced below.

In reference to Table I, the first column entitled MET refers to the meter readings noted by the operator when viewing the digital voltmeter 60 while adjusting the wiper arm 64 of potentiometer 62. These readings each represent a percentage P of the 1.0 volt applied between points A and D during the set-up procedure. Thus, a meter reading of 0.5% is representative of a limiting motor reading of 0.5 megohms as indicated in column 3. Similarly, a 50% meter reading is representative of a limiting motor reading of 50 megohms as indicated in column 3. The second column has a heading entitled $R_P$ and this refers to the part of the resistance portions $R_1$, $R_2$ and resistor R3 which are in the sensing circuit between points B and D. This is given by the formula $$R_P = P(R_1 + R_2 + R_3) = R_2 + R_3 \qquad (1)$$

Thus, for example, for a meter reading of 0.5%, the formula to obtain the resistance $R_P$ yields 502.50 ohms as is indicated in the second column in Table I. Similarly, for a 50% meter reading, the resistance $R_P$ is equal to 50,250 ohms.

The fourth column in Table I refers to the actual total megohms employed in the test circuit which will be described in greater detail hereinafter. This figure includes the reading from the meter under the title MET plus one megohm which reflects the one megohm internal resistor 46 that will be connected in series with the insulation resistance of the motor. Thus, each number in column 4 is equal to the reading in column 3 plus one megohm. The fifth column in Table I is entitled I which represents the DC current that should be flowing in the test circuit if the actual total megohms in column 4 is the correct resistance when 500 volts is applied thereacross. Thus, if the correct megohms is 2.0 with 500 volts applied thereacross, the current reading will be 0.00025 as is seen in column five of Table I.

The sixth column in Table I is headed by $R_T$ which stands for the total resistance in the sensing circuit. The value of resistance $R_T$ may be obtained from the following formula:

$$R_T = R_P + R_4 \qquad (2)$$

The resistance $R_4$ is equal to the effective resistance of the resistance portion of potentiometer 80 as adjusted by a wiper arm 82. This resistance portion is between point D and point E or ground.

With the resistance $R_4$ adjusted to a value of 1,005 ohms, the readings on Table I column 6 are correct. Thus, for example, to obtain a meter reading of 50%, the wiper arm 64 is adjusted so that the value of $R_P$ is 50,250 ohms. This results in a total resistance $R_T$ of 51,255 ohms.

The seventh column in Table I shows the product of the current I in column 5 and the resistance $R_T$ of column 6. In each case, the result is 0.5025 volts DC. This is the level at which the reference voltage $V_R$ is set for use in the comparisons employed in the testing operations to be described hereinbelow.

Once the set-up procedure has been completed, the set-up switch is actuated to its original position as indicated by the solid lines in FIGS. 2 and 3 to de-energize

TABLE I

| MET. | $R_P$ (Ohms) | LIMITING MOTOR MEGOHMS | ACTUAL TOTAL MEGOHMS | I (Amperes) | $R_T$ (Ohms) | I × R (Volts) |
|---|---|---|---|---|---|---|
| .5% | 502.50 | .5 | 1.5 | .00033333 | 1,507.5 | .5025 |
| 1 | 1,005. | 1 | 2 | .00025 | 2,010 | .5025 |
| 10 | 10,050 | 10 | 11 | .00004545 | 11,055 | .5025 |
| 20 | 20,100 | 20 | 21 | .00002381 | 21,105 | .5025 |
| 30 | 30,150 | 30 | 31 | .00001613 | 31,155 | .5025 |
| 40 | 40,200 | 40 | 41 | .00001220 | 41,205 | .5025 |
| 50 | 50,250 | 50 | 51 | .00000980 | 51,255 | .5025 |
| 60 | 60,300 | 60 | 61 | .00000820 | 61,305 | .5025 |
| 70 | 70,350 | 70 | 71 | .00000704 | 71,355 | .5025 |
| 80 | 80,400 | 80 | 81 | .00000617 | 81,405 | .5025 |
| 90 | 90,450 | 90 | 91 | .00000549 | 91,455 | .5025 |
| 100 | 100,500 | 100 | 101 | .00000495 | 101,505 | .5025 | the set-up relay coil SU and reopen relay contacts SU-1 through SU4. The operator will now actuate the test switch 32 to cause a test voltage to be applied to the motor lead 30 by way of the internal one megohm resistor 46 once the normally closed test lead contacts TL-1 become closed. As described hereinbefore, after the operator closes the test switch 32, the test relay coil T is energized to cause the test light 34 to be turned on. Additionally, the test lead relay coil TL is energized to close the normally open test lead contacts TL-1. Moreover, current is now permitted to flow through the primary winding 40 of the transformer T1. The secondary winding 42 of this transformer is connected to a high voltage supply and regulator circuit 100 to be described in greater detail hereinafter and which serves to provide a high DC voltage, on the order of 500 volts, across its output circuit with the negative side being supplied to the internal one megohm resistor 46 and the positive side being supplied by way of the diode 102 to the wiper arm 64 of the potentiometer 62. Current will now flow through the motor's insulation resistance as well as through the internal resistor 46 and, thence, through the high voltage supply circuit 100 and through diode 102, wiper arm 64 of potentiometer 62 and thence through resistors R2, R3, R4 to ground. A test voltage $V_T$ is thereby obtained between ground and the wiper arm 64 at point B. If the actual value of the insulation resistance is less than the limiting value that was selected by the operator during the set-up procedure, then the test current flowing through this circuit will be greater than that anticipated in accordance with column 5, Table I discussed hereinbefore. In such case, the test voltage $V_T$ will exceed the reference voltage $V_R$ and the motor should not be energized.

The reference voltage $V_R$ is obtained from the wiper arm 120 of a potentiometer 122 having a resistance portion connected in series with a resistor 124 between ground and B+ voltage supply source. The reference voltage $V_R$ is adjusted in accordance with the last column of Table I which in the Example being presented herein is a voltage on the order of 0.5025 volts. This is supplied to the negative input of a comparator 130 by way of a resistor 131. The test voltage $V_T$ obtained from the potentiometer wiper arm 64 is supplied to the positive or noninverting input of the comparator 130 by way of a resistor 133.

It is to be noted at this point that even though the insulation resistance may be equal to or greater than the selected limit value, the test current will initially be high as the current flows into the motor windings as a charging current and this may well exceed the current which should flow to the ground through the motor insulation or ground resistance. Consequently, when the combination of ground current and charging current is initially high, the test voltage $V_T$ will exceed the reference voltage $V_R$ and the output of comparator 130 will be high. This is reflected to the input of an integrated switching circuit 140 by way of a resistor 132. Resistor 132 is also connected to a B+ (5 volt DC) supply by way of a resistor 134 and is also connected by capacitor 136 to ground. The integrated circuit 140 will be described in greater detail hereinafter with reference to FIG. 4. For the moment, it is to be understood that whenever the input to the circuit 140 is low, its output is high, and whenever its input is high, its output is low. As discussed above, the test current will initially be high causing the test voltage $V_T$ to exceed the reference voltage $V_R$ and the output of the comparator 130 will be high causing the output of the integrated circuit 140 to be low. This forward biases a red light-emitting diode LED-1 so that current will flow from a B+ voltage supply source through a resistor 150 and thence through the light-emitting diode LED-1 to provide a red illumination to the operator indicative that the motor should not be energized because the current flowing through the test circuit is higher than that anticipated for the selected insulation resistance limiting value.

When the combination of ground current and charging current equals or falls below the value that would flow at the selected limit value, the output of the comparator 130 will go low causing the output of integrated circuit 140 to go high and thereby reverse bias the light-emitting diode LED-1. This forward biases a green light-emitting diode LED-2 by way of a resistor 152 so that the operator will now see a green illumination indicative that the insulation resistance has not decreased below the selected limit value.

When the output of the integrated circuit 140 goes high, it provides charging current through a resistor 154 to charge a capacitor 156 thereby providing a time delay which is set on the order of two seconds before this voltage is supplied to the input of a second integrated circuit 160 and which is identical to integrated circuit 140 to be described hereinafter with reference to FIG. 4. When the input to integrated circuit 160 goes high, its output will go low thereby energizing the transfer relay coil TR by way of the normally closed set-up switch contacts SSW-4 and check switch contacts CSW-2. Energization of the transfer relay coil TR causes its normally closed contacts TR-1 to open thereby de-energizing the test lead relay coil TL. This opens the test lead contacts TL-1 to remove test voltage from the motor lead 30. Additionally, this closes the test lead contacts TL-2 which, along with the now closed transfer relay contacts TR-2, energizes the ready relay coil R. Once the ready relay coil R is energized, its normally open contacts R-1 close to keep the relay coil energized. This causes normally open contacts R-2 to be closed to complete a circuit to energize the ready lamp 50 as well as to complete a circuit by which the operator may close the start switch 22 to energize the motor starter coil M.

During the set-up procedure, the set-up switch is manually operated by the operator from the position shown in the solid lines in FIGS. 2 and 3 to the opposite position so that all normally open switch contacts SSW-1, SSW-2, SSW-3 are closed and the normally closed switch contacts SSW-4 are open. The opening of contacts SSW-4 prevent the transfer relay coil TR from being energized during this procedure. Also, closure of the set-up contacts SSW-1 permit energization of the set-up relay SU whereas closure of the set-up contacts SSW-2 provide operating power including that for the primary winding 40 of transformer T1.

With power supplied to the transformer T1, its secondary winding supplies voltage to a full wave rectifying circuit 300 and a smoothing capacitor 302 to provide a DC voltage to a voltage regulator 304. The voltage regulator 304 serves in the conventional manner to receive an input voltage on the order of 10 volts DC and supplies a B+ voltage (on the order of +5 volts DC) as the operating voltage for the various components illustrated in FIG. 3.

When transformer T1 is energized, its secondary winding 42 supplies 240 volts AC to a high voltage supply and regulator circuit 100 which includes a voltage multiplier for multiplying the voltage to a level on the order of 1,000 volts and a regulator circuit which regulates the output voltage to 500 volts DC. The multiplier circuit includes capacitors 350, 352, 354 and 356 along with diodes 360, 362, 364 and 366 which serve to multiply the input voltage from approximately 240 volts to 1,000 volts DC. The output voltage is then smoothed by a capacitor 370 connected in parallel with a resistor 372. The voltage is then dropped across a resistor 374 to approximately 500 volts where it is smoothed across a capacitor 376 and regulated by five series connected Zener diodes 380 each having a 100 volt rating to thereby maintain a regulated voltage thereacross of 500 volts DC. The negative side of the voltage appears at output terminal 382 and the positive side of the voltage appearing at output terminal 384.

The internal one megohm resistor 46 is chosen to have a high resistance so that when connected in series with the motor's insulation resistance and from the negative terminal of the high voltage supply source 100 to ground, there will be sufficient resistance in the circuit to limit the magnitude of the current flow to a level that will be nondestructive to the motor.

Figure 4:
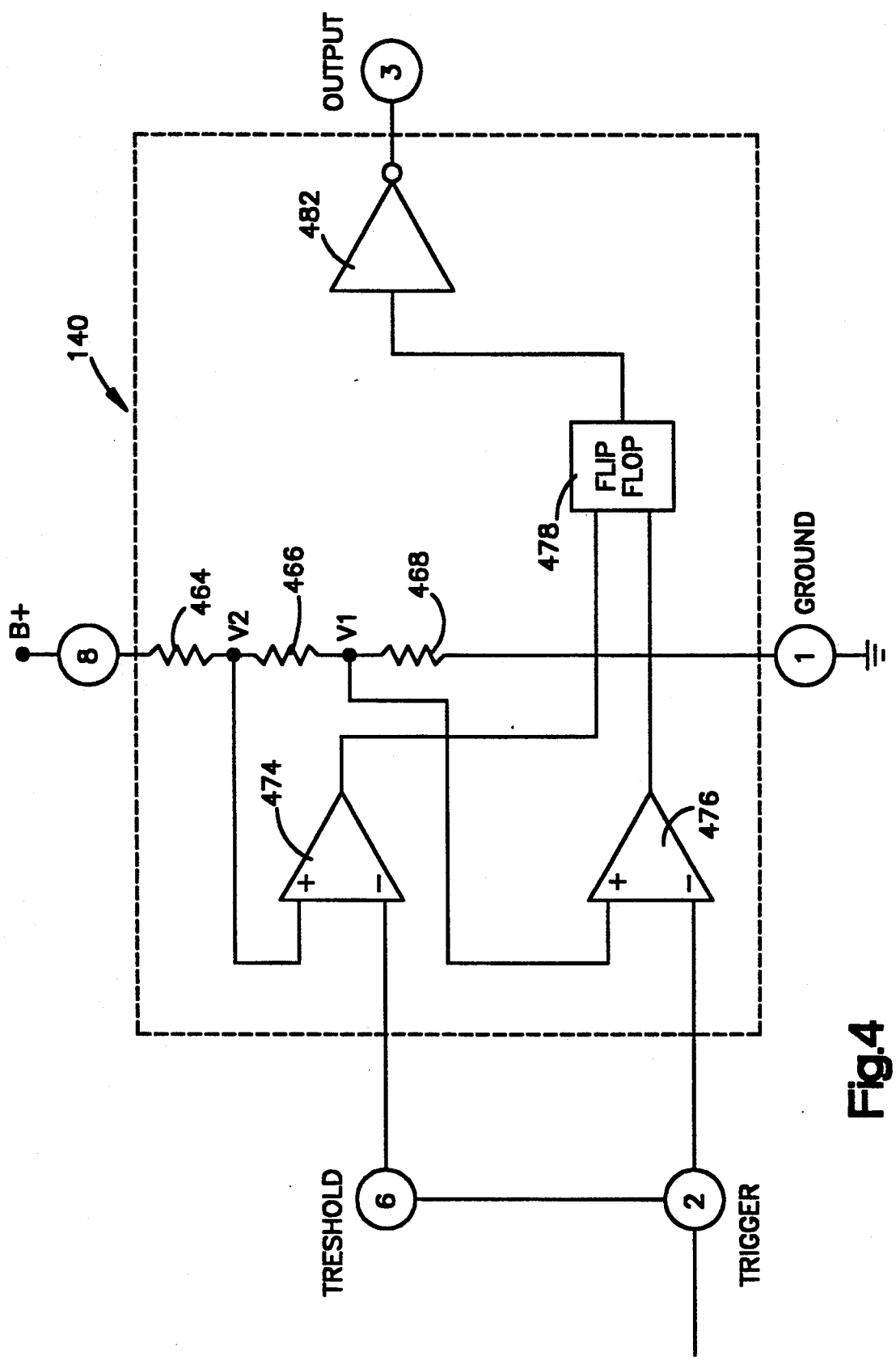
FIG. 4 is a more detailed schematic diagram of the contents of an integrated circuit employed in the schematic diagram of FIG. 3.

The integrated circuit switches 140 and 160 are identical and each takes the form of circuit 140 illustrated in greater detail in FIG. 4 to which reference is now made. This circuit may take the form of Signetics NE555 or its equivalent. As shown in FIG. 4, the integrated circuit includes three equal valued resistors 464, 466 and 468 which are connected in series between ground and a B+ voltage supply. The B+ voltage supply is connected to integrated circuit pin 8 whereas electrical ground is connected to integrated circuit pin 1. These three resistors act as a voltage divider, and provide two reference voltages corresponding to one-third of the supply voltage (at terminal V1 between resistors 466 and 468) and two-thirds (at terminal V2 between resistors 464 and 466) of the supply voltage. Input pins 2 and 6 are connected together to form a common input circuit. A comparator 474 compares an input signal appearing at this common input circuit with the reference limit V2 and provides an output signal having one of two values depending upon the relative magnitudes of the signals being compared. Similarly, a comparator circuit 476 compares an input signal appearing at the common input circuit with a reference voltage V1 and provides an output signal having one of two levels dependent upon the relative magnitudes of the two signals being compared. Thus, with pins 2 and 6 of the integrated circuit being connected together, the comparator circuits 474 and 476 compare the same input signal against two different reference levels V1 and V2. The outputs of the comparator circuits 474 and 476 are connected to a bistable flip-flop 478 and control the logic state thereof.

As brought out hereinbefore, whenever the input to the integrated circuit 140 is high, its output will be low and whenever its input is low, its output will be high. In the circuitry of FIG. 4 it is seen that whenever the input voltage exceeds the reference limit V2, then comparator 474 will set flip-flop 478 causing its output to go high. This is inverted by an inverter amplifier 482 so that the output of circuit 140 at pin 3 will go low. When the input signal drops below the reference signal V1, then the output of comparator 476 will go high to reset flip-flop 478. The output of flip-flop 478 will then go low and this is inverted by the inverter amplifier 482 so that the output of circuit 140 at pin 3 will go high. Also, when the test seems to indicate that the insulation resistance is initially starting to look acceptable, there may be some unstable operation and the output of the integrated circuit 140 may alternately be high and low. During that period, the red and green light-emitting diodes LED-1 and LED-2 will alternately turn on and off. During this period of instability, the diode 157 will discharge the capacitor 156 each time the output of circuit 140 goes low thereby tending to prevent switch 160 from being actuated during short intervals when the output of circuit 140 goes high.

In addition to the foregoing, the circuitry herein includes a check switch CSW which has a normally open set of switch contacts CSW-1 (see FIG. 2) and a normally closed set of switch contacts CSW-2 (FIG. 3). When this switch is actuated, the contacts CSW-1 are closed to apply power to the test relay coil T and the test lead relay coil TL to obtain the test operation function described hereinbefore. However, with the switch contacts CSW-2 being open (FIG. 3), the test operation will not cause energization of the transfer relay coil TR. Thus, if the test procedure determines that the insulation resistance is proper, the green light LED-2 will be turned on and the output of integrated circuit 160, after a short time delay, will go low. This would normally cause energization of the relay coil TR to, in turn, cause power to be removed from the circuit in the manner as described hereinabove with respect to the test procedure. Consequently, during the period that the check switch CSW has its normally open contact CSW-1 closed and its normally closed contact CSW-2 in an open condition, the operator may adjust the wiper arm 64 on the potentiometer 62 to determine the point at which further adjustment in either direction will cause alternate energization of the red and green indicator lights LED-1 and LED-2. That serves as a measure of the actual megohms presented by the motor's insulation resistance.

Whereas the invention has been described in conjunction with a preferred embodiment, it will be appreciated that various modifications may be made without departing from the spirit and scope of the invention as defined by the appended claims.

Having described the invention, the following is claimed:

1. Apparatus for use with a starting circuit for an electric motor for preventing start-up of said motor when the motor's insulation resistance is of a value below a selected insulation resistance limit value below which the motor should not be energized, and wherein said selected limit value is a selected percentage of a known maximum value and comprising:

variable resistance means for providing an adjustable resistance and having adjustable first and second resistance portions and having means for adjusting said resistance portions so that said second resistance portion may be adjusted so that its resistance value relative to the total resistance value of both said first and second resistance portions is the same percentage as said selected percentage;

means for applying a known DC voltage to said motor's insulation resistance to cause a test current to flow therethrough;

means for directing said test current to flow through said second resistance portion to develop a test voltage;

means for providing a reference voltage having a value representative of the voltage that would be developed across the second resistance portion by said test current if the insulation resistance value was equal to the selected insulation resistance limit value;

means for comparing said test voltage with said reference voltage and providing a control signal having a first value when the test voltage is greater than said reference voltage and a second value when said test voltage is less than said reference voltage; and means responsive to said control signal for preventing energization of said motor so long as said motor control signal is of said first value.

2. Apparatus as set forth in claim 1 wherein said variable resistance means includes a potentiometer and wherein said means for adjusting said resistance portions includes a wiper arm on said potentiometer adapted to be manually operated for adjusting said resistance portions.

3. Apparatus as set forth in claim 2 including setup circuit means for providing a setup function and including means for applying a known step voltage to said potentiometer and means for measuring the response thereto between electrical ground and said wiper arm.

4. Apparatus as set forth in claim 3 wherein a third resistor is connected in series with said first and second resistance portions, said setup circuit means includes means for connecting said first and second resistance portions together with said third resistor in series together between electrical ground and said known setup voltage.

5. Apparatus as set forth in claim 2 including a third resistor connected in series with said first and second resistor portions and a fourth variable resistance portion connected to said third resistor and with electrical ground in such a manner so that said test voltage is developed between said electrical ground and the wiper arm of said potentiometer.

6. Apparatus as set forth in claim 1 including a test lead for use in applying said DC voltage to said motor's insulation resistance and wherein said test lead is connected in series with an internal test resistor for limiting the value of the test current flowing through said motor's insulation resistance.

7. Apparatus as set forth in claim 1 wherein said means for providing a reference voltage includes means for varying the value of said reference voltage.

8. Apparatus as set forth in claim 7 wherein said means for varying includes a potentiometer having a wiper arm.

9. Apparatus as set forth in claim 1 including first indicator means for providing an indication function and circuit means responsive to said control signal having a said first value for energizing said first indicator means to provide an operator with an indication that the motor's insulation resistance is of a value below the selected insulation resistance limit value and that the motor should not be energized.

10. Apparatus as set forth in claim 1 including second indicator means for providing an indication function and circuit means responsive to said control signal having a said second value for energizing said second indicator means to provide a visual indication to an operator that the motor's insulation resistance value is not below that of the selected insulation resistance limit value and that the motor may be energized.

11. A method of determining whether to start operation of an electric motor wherein the motor has an insulation resistance of an unknown value and including the steps of:

selecting a limit value of said insulation resistance below which the motor should not be energized, and wherein said selected limit value is a selected percentage of a known maximum limit value;

adjusting variable resistance means having a variable resistance and having first and second adjustable resistance portions so that the adjusted resistance vale of said second portion is of the same percentage of the total resistance value of said first and second portions as said selected percentage;

applying a DC voltage of a known value to said motor's insulation resistance to cause a test current to flow therethrough;

directing said test current to flow through said second resistance portion to develop a test voltage;

providing a reference voltage having a value representative of the voltage that would be developed across the second resistance portion by said test current if the unknown value of said insulation resistance was equal to the selected insulation resistance limit value;

comparing said test voltage with said reference voltage and providing a control signal having a first value when the test voltage is greater than the reference voltage, and a second value when the test voltage is less than the reference voltage; and preventing energization of said motor so long as the control signal is of said first value.

12. A method as set forth in claim 11 wherein said variable resistance means has said first and second resistance portions connected in a series circuit with a third resistor and a fourth variable resistor and wherein said step of directing said test current includes direction said test current to flow through said second resistance portion as well as through said third resistor and said fourth resistance portion to develop a said test voltage.

13. A method as set forth in claim 12 including the further step of energizing a first visual indicator so long as said control signal is of said first value.

14. A method as set forth in claim 11 including the further step of energizing a second visual indicator so long as the control signal is of said second value.

* * * * *